United States Patent
Malinen

(10) Patent No.: US 10,597,778 B2
(45) Date of Patent: Mar. 24, 2020

(54) ALD METHOD AND APPARATUS INCLUDING A PHOTON SOURCE

(71) Applicant: Picosun Oy, Espoo (FI)

(72) Inventor: Timo Malinen, Espoo (FI)

(73) Assignee: Picosun Oy, Espoo (FI)

( * ) Notice: Subject to any disclaimer, the term of this patent is extended or adjusted under 35 U.S.C. 154(b) by 0 days.

(21) Appl. No.: 15/536,853

(22) PCT Filed: Nov. 25, 2015

(86) PCT No.: PCT/FI2015/050820
§ 371 (c)(1),
(2) Date: Jun. 16, 2017

(87) PCT Pub. No.: WO2016/102749
PCT Pub. Date: Jun. 30, 2016

(65) Prior Publication Data
US 2017/0342563 A1    Nov. 30, 2017

(30) Foreign Application Priority Data

Dec. 22, 2014   (FI) ..................................... 20140362

(51) Int. Cl.
*C23C 16/48*   (2006.01)
*C23C 16/455*   (2006.01)
*C23C 16/54*   (2006.01)

(52) U.S. Cl.
CPC .. *C23C 16/45544* (2013.01); *C23C 16/45536* (2013.01); *C23C 16/45553* (2013.01); *C23C 16/482* (2013.01); *C23C 16/54* (2013.01)

(58) Field of Classification Search
CPC .. C23C 16/45525; C23C 16/482; C23C 16/54
See application file for complete search history.

(56) References Cited

U.S. PATENT DOCUMENTS

| | | | |
|---|---|---|---|
| 4,895,107 A * | 1/1990 | Yano | C23C 16/4409 118/719 |
| 5,062,508 A | 11/1991 | Ackermann et al. | |
| 5,728,224 A | 3/1998 | Laurent et al. | |
| 2006/0214305 A1 | 9/2006 | Sakata et al. | |

(Continued)

FOREIGN PATENT DOCUMENTS

| CN | 1449303 A | 10/2003 |
|---|---|---|
| CN | 102492939 A | 6/2012 |

(Continued)

OTHER PUBLICATIONS

Extended European Search Report received for European Patent Application No. EP15872019.3, dated Dec. 18, 2017, 7 pages.

(Continued)

*Primary Examiner* — Elizabeth A Burkhart
(74) *Attorney, Agent, or Firm* — Ziegler IP Law Group, LLC

(57) ABSTRACT

A deposition method, including providing a channel through a deposition apparatus, feeding precursor vapor into the channel, and depositing material from the precursor vapor onto a substrate on its way through the deposition apparatus by exposing the substrate to the precursor vapor and to alternating photon exposure and shade periods within the channel.

16 Claims, 4 Drawing Sheets

(56) References Cited

U.S. PATENT DOCUMENTS

| | | | |
|---|---|---|---|
| 2007/0259111 A1* | 11/2007 | Singh | C23C 16/0209 427/248.1 |
| 2011/0300716 A1 | 12/2011 | Park et al. | |
| 2013/0280860 A1 | 10/2013 | Tellez Oliva | |
| 2014/0004713 A1 | 1/2014 | Igeta et al. | |
| 2015/0292085 A1* | 10/2015 | Baisl | H01L 51/0021 427/532 |

FOREIGN PATENT DOCUMENTS

| | | |
|---|---|---|
| DE | 102012221080 A1 | 3/2014 |
| EP | 1348483 A1 | 10/2003 |
| EP | 2592173 A2 | 5/2013 |
| EP | 2799559 A1 | 11/2014 |
| JP | S59-92523 A | 5/1984 |
| JP | S6357771 A | 3/1988 |
| RU | 2436727 C2 | 12/2011 |
| WO | 2011009681 A1 | 1/2011 |
| WO | 2012013824 A1 | 2/2012 |
| WO | 2014076276 A1 | 5/2014 |

OTHER PUBLICATIONS

Finnish Patent and Registration Office Search Report, Application No. 20140362, dated Jul. 6, 2015, 2 pages.

International Search Report, Application No. PCT/FI2015/050820, dated Feb. 26, 2016, 6 pages.

Written Opinion of the International Searching Authority, Application No. PCT/FI2015/050820, dated Feb. 26, 2016, 7 pages.

First Office Action issued for Chinese Patent Application No. CN201580069843X, dated Oct. 17, 2018, 8 pages including 2 pages of English Translation.

Chinese Search Report received for Chinese Patent Application No. 201580069843X, dated Oct. 9, 2018, 2 pages, partial English translation available.

Russian Search report of Patent Application No. 2017124606 dated May 8, 2019, 9 pages.

* cited by examiner

ALD METHOD AND APPARATUS INCLUDING A PHOTON SOURCE

FIELD

The aspects of the disclosed embodiments generally relate to deposition techniques in which material is deposited onto a substrate surface.

BACKGROUND

This section illustrates useful background information without admission of any technique described herein representative of the state of the art.

Atomic Layer Deposition (ALD) is a special chemical deposition method based on sequential introduction of at least two reactive precursor species to at least one substrate in a reaction space. The growth mechanism of ALD relies on the bond strength differences between chemical adsorption (chemisorption) and physical adsorption (physisorption). ALD utilizes chemisorption and eliminates physisorption during the deposition process. During chemisorption a strong chemical bond is formed between atom(s) of a solid phase surface and a molecule that is arriving from the gas phase.

An ALD deposition cycle consists of four sequential steps: pulse A, purge A, pulse B, and purge B. Pulse A consists of metal precursor vapor and pulse B of non-metal precursor vapor. Inactive gas, such as nitrogen or argon, and a vacuum pump are used for purging gaseous reaction by-products and the residual reactant molecules from the reaction space during purge A and purge B. A deposition sequence comprises at least one deposition cycle. Deposition cycles are repeated until the deposition sequence has produced a thin film of desired thickness.

Precursor species form through chemisorption a chemical bond to reactive sites of substrate surface. No more than a molecular monolayer of a solid material forms on the surface during one precursor pulse. The growth process is thus self-terminating or saturative. For example, the first precursor can include ligands that remain attached to the adsorbed species and saturate the surface, which prevents further chemisorption. Reaction space temperature is maintained above condensation temperatures and below thermal decomposition temperatures of the utilized precursors such that the precursor molecule species chemisorb on the substrate(s) essentially intact. Essentially intact means that volatile ligands may come off the precursor molecule when the precursor molecules species chemisorb on the surface. The surface becomes essentially saturated with the first type of reactive sites, i.e. adsorbed species of the first precursor molecules. This chemisorption step is followed by a first purge step (purge A) wherein the excess first precursor and possible reaction by-products are removed from the reaction space. Second precursor vapor is then introduced into the reaction space. Second precursor molecules react with the adsorbed species of the first precursor molecules, thereby forming the desired thin film material. This growth terminates once the entire amount of the adsorbed first precursor has been consumed and the surface has essentially been saturated with the second type of reactive sites. The excess of second precursor vapor and possible reaction by-product vapors are then removed by a second purge step (purge B). The cycle is then repeated until the film has grown to a desired thickness.

Thin films grown by ALD are dense, pinhole free and have uniform thickness. For example, in an experiment aluminum oxide has been grown by ALD from trimethylaluminum $(CH_3)_3Al$, also referred to as TMA, and water resulting in only about 1% non-uniformity over a substrate wafer.

One problem of the ALD technology is the rather slow growth rate.

SUMMARY

The aspects of the disclosed embodiments are directed to providing a deposition method with a relatively fast growth rate.

According to a first example aspect of the disclosed embodiments there is provided a deposition method, comprising:

providing a channel through a deposition apparatus, feeding precursor vapor into the channel;

depositing material from the precursor vapor onto a substrate on its way through the deposition apparatus by exposing the substrate to the precursor vapor and to alternating photon exposure and shade periods within the channel.

In certain example embodiments, the channel restricts movement of the precursor vapor in a vertical direction. In certain example embodiments, a reaction space is defined by a channel top part and the substrate. In certain example embodiments, the reaction space has a limited height limiting the vertical movement of precursor vapor. In certain example embodiments the vertical dimension of the reaction space is less than 2 mm, in certain other example embodiments less than 5 mm, in certain other example embodiments less than 10 mm, in certain other example embodiments less than 5 cm, and in certain other example embodiments less than 10 cm.

In certain example embodiments, the precursor vapor comprises a first precursor species and a second precursor source gas, the second precursor source gas functioning as carrier gas for the first precursor species. In certain example embodiments, a second precursor species is activated from the second precursor source gas by photon exposure. In certain example embodiments, the first precursor species and the second precursor source gas/second precursor species are present in a same volume (mixed with each other). In certain example embodiments, the first precursor species is a metal precursor species and the second precursor species a non-metal precursor species. In certain other embodiments, both precursor species are non-metal precursor species. Examples of coating materials are, for example, metals, oxides, and nitrides.

In certain example embodiments, a first precursor species reacts with reactive sites on the substrate surface on the shade period and, on the following photon exposure period, a second precursor species reacts with chemisorbed first precursor species.

In certain example embodiments, the method comprises: causing the reaction on the photon exposure period by received photon energy.

In certain example embodiments, the method comprises: defining photon exposure and shade periods by shading the substrate surface so that an area of shade has the shade period and a non-shaded area the photon exposure period.

In certain example embodiments, reactions during the shade period are self-saturative surface reactions. In certain example embodiments, the shade period terminates material growth until the following photon exposure. In certain example embodiments, deposition is based on self-saturative growth in which material growth terminates on the shade period when all reactive sites for the first precursor have been consumed on the substrate surface.

In certain example embodiments, deposition cycles are performed without performing purge periods.

A deposition cycle may be considered to begin with the shade period or with the photon exposure period. The first deposition cycle may begin with a shade period during which the first precursor reacts with the substrate surface. The photon exposure period then immediately follows the shade period. The photon exposure period produces half a monolayer of deposited material. And, the shade period produces half a monolayer of deposited material. The photon exposure and shade period altogether produce a monolayer of deposited material (coating material).

The first and second precursor species may be selected so that they are inert with respect to each other in gas phase in normal process conditions, i.e., in the processing temperature without activation (excitation). In certain example embodiments, the second precursor species is inert towards the adsorbed first precursor species without activation whereas the first precursor species is reactive, also without activation, with the second precursor species adsorbed to the surface.

In certain example embodiments, the periods of photon exposure and shade alternate, wherein photon exposure occurs only during the photon exposure period. The photon exposure may be implemented by photons emitted by a photon source, such as an UV lamp, a LED lamp, a xenon lamp, an X-ray source, a laser source, or an infrared source.

In certain example embodiments, the number of precursor species is more than two. In these embodiments, one of the precursors may be reactive with the surface without excitation the other precursors being inert towards surface reactions without excitation.

The method in accordance with the first example aspect and its embodiment can be used for a plurality of different applications, for example, for coating any applicable moving substrate. The substrate may be, for example, a plate-like object, such as silicon wafer, a glass plate, a metal foil. The substrate may be a substrate web, a strand or a strip. The substrate may be a thin flexible glass substrate. It may be a polymer. It may be a fibrous web of paper, board or nanocellulose. It may be a solar cell, an OLED display, a printed circuit board component or generally a component of electronics. The method can be used for low temperature passivation of heat sensitive applications.

According to a second example aspect of the disclosed embodiments there is provided a deposition apparatus, comprising:
a channel through the deposition apparatus;
at least one in-feed line for feeding precursor vapor into the channel, the deposition apparatus being further configured to
deposit material from the precursor vapor onto a substrate on its way through the deposition apparatus by exposing the substrate to the precursor vapor and to alternating photon exposure and shade periods within the channel.

In certain example embodiments, the channel is configured to restrict movement of the precursor vapor in a vertical direction.

In certain example embodiments, the deposition apparatus comprises an input slit for inputting the substrate into the channel and an output slit for outputting the substrate from the channel.

In certain example embodiments, the precursor vapor comprises a first precursor species and a second precursor source gas, and the apparatus is configured to use the second precursor source gas as carrier gas for the first precursor species.

In certain example embodiments, the apparatus is configured to cause:
a first precursor species to react with reactive sites on the substrate surface on the shade period and, on the following photon exposure period, a second precursor species to react with chemisorbed first precursor species.

In certain example embodiments, the apparatus comprises:
a photon source configured to emit photon energy to cause the reaction on the photon exposure period.

In certain example embodiments, the apparatus comprises:
a shader in between the substrate and a photon source having photon permeable areas and photon impermeable areas to define photon exposure and shade periods by shading the substrate surface so that an area of shade has the shade period and a non-shaded area the photon exposure period.

In certain example embodiments, a roof of the channel is formed by a plane-like shader where at least the lower surface of the shader is planar.

Different non-binding example aspects and embodiments of the present disclosure have been illustrated in the foregoing. The above embodiments are used merely to explain selected aspects or steps that may be utilized in implementations of the aspects of the disclosed embodiments. Some embodiments may be presented only with reference to certain example aspects. It should be appreciated that corresponding embodiments may apply to other example aspects as well. Any appropriate combinations of the embodiments may be formed.

BRIEF DESCRIPTION OF THE DRAWINGS

The disclosed embodiments will now be described, by way of example only, with reference to the accompanying drawings, in which.

DETAILED DESCRIPTION

Figure 1:
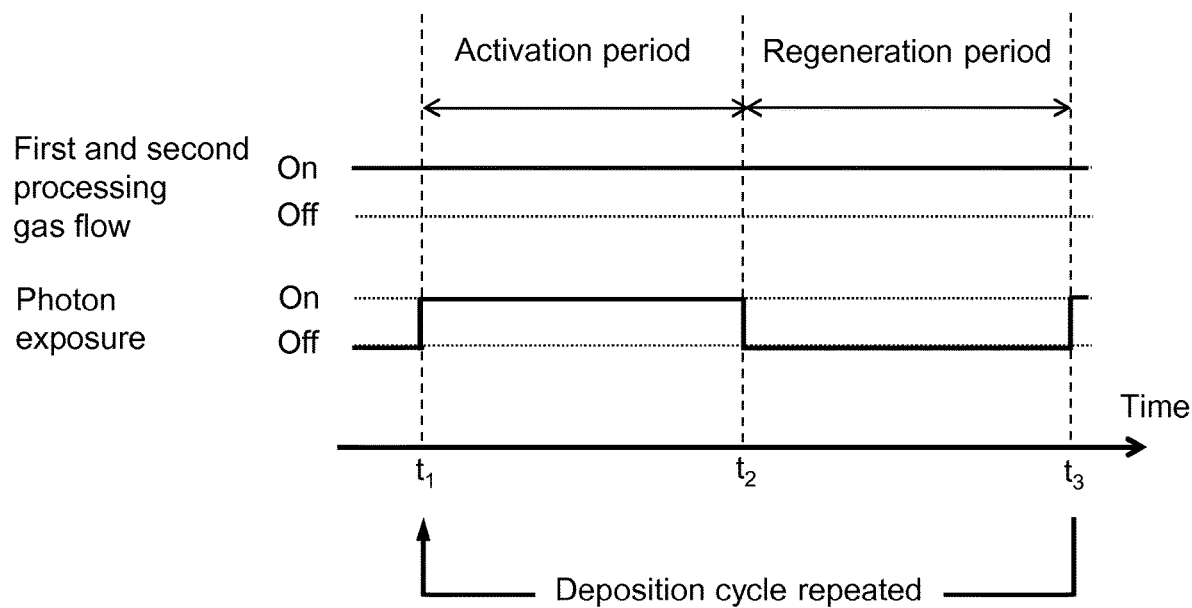
FIG. 1 shows an example timing diagram of a method in accordance with an example embodiment.

FIG. 1 shows an example timing diagram of a method in accordance with an example embodiment. A deposition sequence comprising a plurality of deposition cycles is performed where each cycle produces a monolayer of deposited material. The deposition cycle comprises introducing a first precursor species and a second precursor species to a substrate surface in a reaction space.

A method is implemented, comprising providing a channel through a deposition apparatus, feeding precursor vapor into the channel, and depositing material from the precursor vapor onto a substrate on its way through the deposition apparatus by exposing the substrate to the precursor vapor and to alternating photon exposure and shade periods within the channel. The method can be denoted as a photon assisted surface coating application (PASCA) method.

In the example shown in FIG. 1, an activation period (from time instant $t_1$ to $t_2$) during which photon exposure is on and a regeneration period (from time instant $t_2$ to $t_3$) during which photon exposure is off are alternated. The activation period in FIG. 1 therefore forms the photon exposure period of the method and the regeneration period the shade period of the method.

During the regeneration period, the precursor species of a first processing gas (first precursor species) reacts with reactive sites on the substrate surface by chemisorption. In the end of the regeneration period the substrate surface is covered by the first precursor species adhered to the substrate surface. The second processing gas (second precursor source gas) is inert towards the surface without photon exposure. Accordingly, the material growth terminates in the end of the regeneration period when all reactive sites for the first precursor species are consumed. The growth mechanism is self-saturative.

During the activation period, the precursor species of the second processing gas (second precursor species) reacts, by chemisorption, with the first precursor species adhered to the substrate surface leading to the situation in which the substrate surface becomes covered by the second precursor species adhered to the substrate surface.

The activation period reaction occurs on the substrate area which is exposed to photon energy. The photon exposure gives either the second processing gas or the adhered first precursor species the additional energy required for a surface reaction to occur.

In a first alternative, the second processing gas is excited by photon energy to form radicals. These radicals (i.e., the second precursor species) react with the reactive sites of the adhered first precursor species on the substrate surface. The substrate surface becomes saturated by the second precursor species.

In a second alternative, the adhered first precursor species is excited by photon energy. This gives the additional energy required to the reaction between the first precursor species adsorbed to the substrate surface and the gaseous second precursor species. As a result, the substrate surface becomes saturated by the second precursor species.

The desired alternative may be selected by adjusting the wavelength of the photons (i.e., light/radiation).

The deposition cycle formed by the activation period and the immediately following regeneration period (or by the regeneration period and the immediately following activation period in certain embodiments) is repeated to obtain a coating of a desired thickness. The deposition cycle is performed without a purge period therefore achieving a faster growth rate compared to self-saturative growth methods in which purge periods are used.

The first processing gas and second processing gas flow to the reaction space is maintained during the whole deposition cycle. In certain example embodiments, the second processing gas is used as carrier gas for the first processing gas (first precursor species). In those embodiments, the first precursor and the second precursor may be present in the reaction space simultaneously.

The first precursor may be a metal precursor and the second precursor a non-metal precursor. In certain other embodiments, both precursor species are non-metal precursor species. Examples of coating materials are, for example, metals, oxides, and nitrides. The precursors may be selected so that they are inert towards each other in gas phase. In an example embodiment, trimethylaluminium (TMA, $(CH_3)_3Al$) is used as a metal precursor and oxygen ($O_2$) as the second processing gas. Then during the photon exposure period, oxygen is excited to oxygen radicals O*, surface reaction takes place between O* radicals and adsorbed TMA to form the desired coating material, aluminium oxide ($Al_2O_3$).

Figure 2:
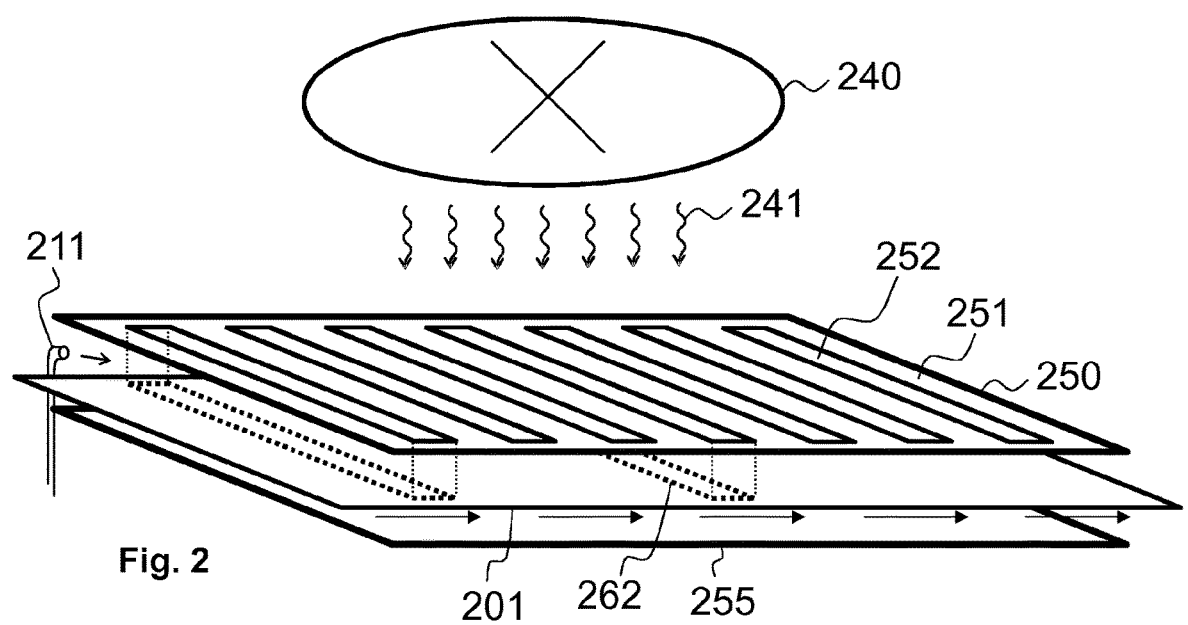
FIG. 2 shows an example construction for implementing the method in accordance with an example embodiment.

FIG. 2 shows an example construction for implementing the disclosed method in accordance with an example embodiment. The construction comprises in a deposition apparatus (for example, a reactor module) a channel through the deposition apparatus. In the example shown in FIG. 2, the channel is formed by a bottom part 255 and a top part 250 that form the channel therebetween. The channel is a horizontal channel with a limited height. An in-feed line conveys precursor vapor into the channel through a gas distribution nozzle 211 or similar. The top and bottom parts 250, 255 are plates or plane-like parts, or at least the channel side of the top part 250 is planar. The channel side of the bottom part may also be planar. The channel may be open on the sides.

A planar substrate 201 is moved along the channel. In an alternative embodiment, the planar substrate 201 is a support web supporting at least one substrate or a set of substrates (not shown) travelling on it.

A photon source 240 is placed on the top of the top part 250. The photon source 240 can be an UV lamp, a xenon lamp, LED lamp or, for example, an X-ray source, a laser source, or an infrared source. It provides photon exposure by emitting photons 241.

The top part 250 may be a shader comprising photon impermeable areas 251 and photon permeable areas (or windows) 252 to define photon exposure and shade periods by shading the surface of the substrate 201 beneath the shader. The photon permeable areas may be formed of glass or other material through which the precursor vapor cannot penetrate. While the substrate propagates beneath the shader, an area of shade has the shade period and a non-shaded area 262 the photon exposure period. In an example embodiment, half a monolayer of desired coating material grows when the substrate is on the shade and half of a monolayer grows when the substrate is on the non-shaded area. In such an embodiment, the number of photon impermeable areas and permeable areas define the number of cycles and thus the obtained thickness of the desired coating.

The reaction space is defined by the top part 250 and the substrate 201. The reaction space has a limited height limiting the vertical movement of precursor vapor so that the main direction of movement of the vapor is a horizontal direction. In certain example embodiments the vertical dimension of the reaction space (and of the channel) is less than 2 mm, in certain other example embodiments less than 5 mm, in certain other example embodiments less than 10 mm, in certain other example embodiments less than 5 cm, and in certain other example embodiments less than 10 cm.

The in-feed line conveys precursor vapor into the reaction space so that the reaction space is populated by the first and second precursor species. The in-feed may be from one or more nozzles on the side or, as described later in this description, from the top of the substrate through a shader nozzle. A vacuum pump in an evacuation line (not shown in FIG. 2) maintains an outgoing flow from the reaction chamber.

The precursor vapor comprises the first precursor species and the second precursor source gas, the second precursor source gas functioning as carrier gas for the first precursor species. In certain other embodiments, however, the first precursor species in-feed into the reaction space can occur via separate in-feed line with respect to the in-feed of the second precursor species (which may have its own in-feed line).

Figure 3:
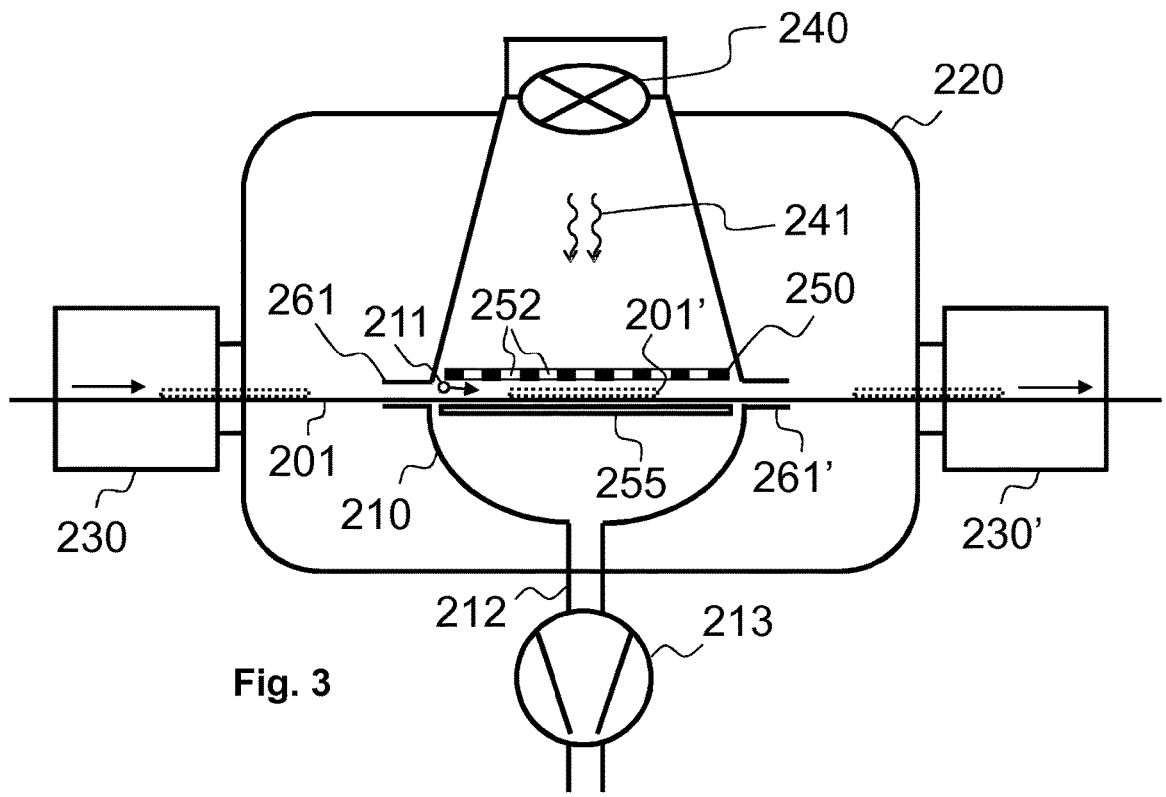
FIG. 3 shows a side view of an example apparatus in accordance with an example embodiment.

FIG. 3 shows a side view of an example apparatus in accordance with an example embodiment. The apparatus can be a reactor or a reactor module suitable for continuous deposition as a part of a processing line. The apparatus comprises a reaction chamber 210 which is surrounded by an outer chamber 220. An intermediate space between the outer chamber 220 and the reaction chamber 210 is pressurized by conveying inactive shield gas to the space so that there is a slight overpressure compared to the interior of the reaction chamber 210.

A first transfer chamber 230 is attached to a side of the outer chamber 220, and a second transfer chamber 230' is attached to an opposite side of the outer chamber 220. The reaction chamber 210 positioned within the outer chamber comprises an input port 261 on its first side and an output port 261' on an opposite side. The input port 261 and the output port 261' may be formed as a slit in a respective reaction chamber wall.

A substrate web 201 to be coated is driven continuously through the first transfer chamber 230 into the outer chamber 220, therefrom through the input port 261 into the reaction chamber 210 for deposition, and therefrom through the output port 261' into an opposite part of the outer chamber 220, and through the second transfer chamber 230' to a subsequent phase of the processing line. In an alternative embodiment, the substrate web 201 is a web supporting a set of substrates 201' (to be coated) travelling on it. In yet an alternative embodiment, the substrate is a strand or a strip.

The apparatus comprises the construction shown in FIG. 2. Accordingly, the apparatus comprises the channel formed by the top and bottom parts 250, 255 extending through the reaction chamber 210, the photon source 240 on the top of the top part 250. Furthermore, the apparatus comprises the in-feed line which conveys precursor vapor (via nozzle 211 or similar) into the reaction space defined in between the top part 250 and the substrate 201.

The apparatus further comprises an evacuation line 212 and a vacuum pump 213 in the evacuation line to maintain vacuum pressure in the reaction chamber, if desired, and to maintain an outgoing flow from the reaction chamber.

The apparatus operates similarly as described with reference to FIGS. 1 and 2. Accordingly, when the substrate 201 or 201' moves forward different areas of the substrate see the photon source 240. An area of shade has the shade period (regeneration period) and a non-shaded area the photon exposure period (activation period). Deposition cycles described in the foregoing with reference to FIGS. 1 and 2 are performed.

During the shade period, the first precursor species reacts with reactive sites produced by the adhered second precursor species on the substrate surface. And, during the photon exposure period, the second precursor species reacts with the first precursor species adhered to the substrate surface. Accurate thickness control of material growth is achieved by maintaining the propagation speed of the substrate with respect to the width of the non-shaded area on a level that half a monolayer of desired coating material grows when the substrate is on the shaded area and the remaining half of a monolayer grows when the substrate is on the non-shaded area.

Certain example embodiments are implemented without including any transfer chamber(s) for loading and/or unloading. Furthermore, certain example embodiments are implemented without including an outer chamber around the reaction chamber. Furthermore, the reaction chamber form can deviate from the example form presented in the Figures. In certain example embodiments, the channel through the apparatus forms the reaction chamber. Accordingly, there is no separate reaction chamber in excess to the channel. In certain example embodiments, the substrate propagates through the channel continuously at a constant speed. In certain other embodiments, the substrate is periodically moved (e.g., in a stop and go fashion) through the channel.

Figure 4:
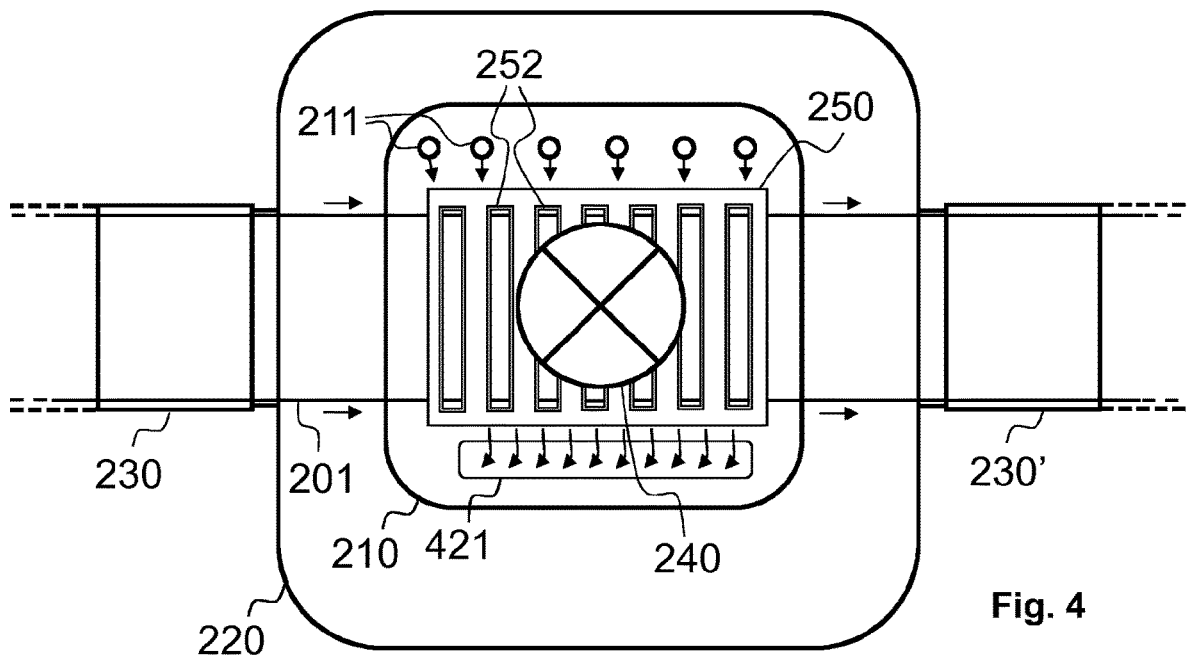
FIG. 4 shows a top view of an apparatus in accordance with an example embodiment.

FIG. 4 shows a top view of an apparatus in accordance with an example embodiment. Same reference signs as in FIGS. 2 and 3 have been used for similar features. The in-feed of precursor vapor can be arranged from one side and the evacuation of gases from the opposite side. In the embodiment of FIG. 4, a row of in-feed nozzles 211 of precursor vapor in-feed line is on a first side of the substrate 201 and an evacuation line mouth 421 on the opposite side.

Figure 5:
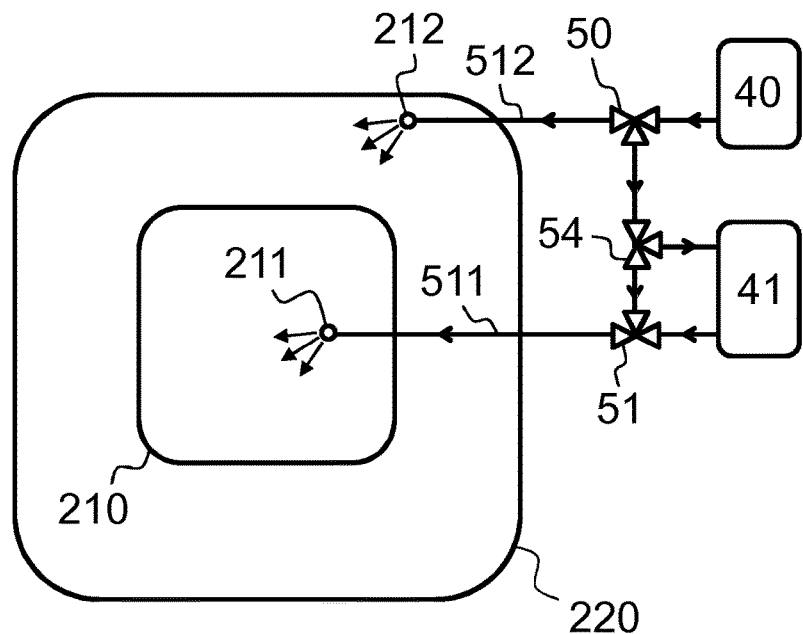
FIG. 5 shows process gas in-feed in accordance with an example embodiment.

FIG. 5 shows process gas in-feed in accordance with an example embodiment in which the second processing gas is used as carrier gas for the first processing gas. The apparatus may be of the type shown in FIGS. 3 and 4. The apparatus comprises a first processing gas source 41 and a second processing gas source 40.

The second processing gas source 40 is in fluid communication with the input of a carrier and shield gas line valve 50. A first output of valve 50 leads as a shield gas line 512 into an intermediate space between an outer chamber 220 and a reaction chamber 210 of the apparatus. The second processing gas in the property of inactive shield gas is released to the intermediate space via a gas release point 212. A second output of valve 50 is in fluid communication with the input of a carrier gas input valve 54. A first output of valve 54 is in fluid communication with a carrier gas input of the first processing gas source 41. A second output of valve 54 is in fluid communication with a second input of a precursor vapor in-feed line valve 51. The first processing gas source 41 is in fluid communication with a first input of valve 51. The output of valve 51 continues as a precursor vapor in-feed line 511 towards the reaction chamber 210. The gas/vapor flowing in the in-feed line 511 is released to the said channel in the reaction chamber 211 via a gas release point or nozzle 211. The routes from the second processing gas source 40 to the first processing gas source 41 and therefrom to the in-feed line 511 are kept open during processing.

The shield gas line 512 is kept open or closed depending on implementation. In certain example embodiments, the shield gas line 512 is kept open during the whole deposition cycle/sequence allowing second processing gas in the property of inactive shield gas to enter the intermediate space via the gas release point 212.

Figure 6:
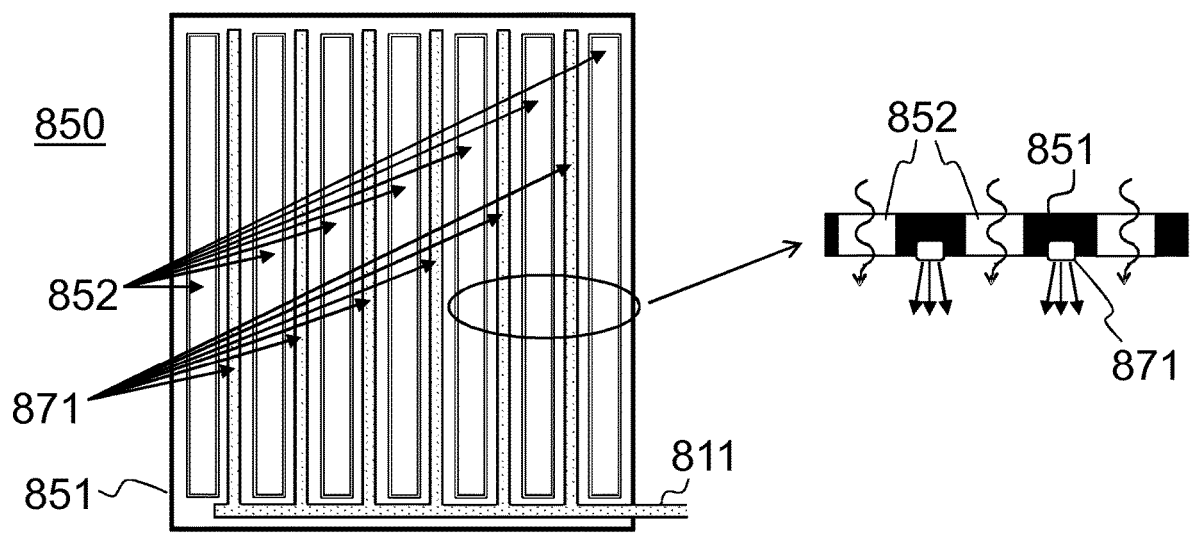
FIG. 6 shows an example shader in accordance with an example embodiment.

FIG. 6 shows an example shader in accordance with an example embodiment. The shader (or shader nozzle) 850 can be used both as a shader and as a precursor in-feed nozzle. It can be used as the top part 250. The shader 850 comprises a shader frame 851 with solid portions through which the emitted photons cannot penetrate and rectangular windows 852 made of glass, for example, through which the emitted photons can penetrate (but through which the precursor vapor cannot penetrate). The form of the windows 852 depends on the implementation. A precursor in-feed line 811 is attached to the shader 850. The in-feed line 811 branches to individual lateral flow channels 871 which extend throughout the shader frame 851 along the solid portions. The flow channels 871 have a plurality of apertures (not shown) on their lower surface to guide precursor vapor downwards towards the substrate surface.

On the right side of FIG. 6 is a partial cross-section of the shader 850. The black portions show photon impermeable areas and the white portions photon permeable areas. The flow channels 871 have been embedded into the frame 851 of the shader.

In certain example embodiment, in which the shader 850 is used to distribute precursor vapor on the substrate surface from the top side of the substrate, the evacuation of gases into an evacuation line can occur from both sides of the substrate.

In accordance with certain example embodiments, the precursor vapor in-feed line(s) of the apparatuses described in the preceding are implemented by the required pipings and their controlling elements.

The in-feed line controlling elements comprise flow and timing controlling elements. In an example embodiment, a precursor vapor in-feed line valve and mass (or volume) flow controller in a precursor vapor in-feed line control the timing and flow of precursor vapor into the reaction chamber. Correspondingly, a carrier and shield gas line valve and mass (or volume) flow controller in fluid communication with a second processing gas source control the timing and flow of the carrier and shield gas.

Figure 7:
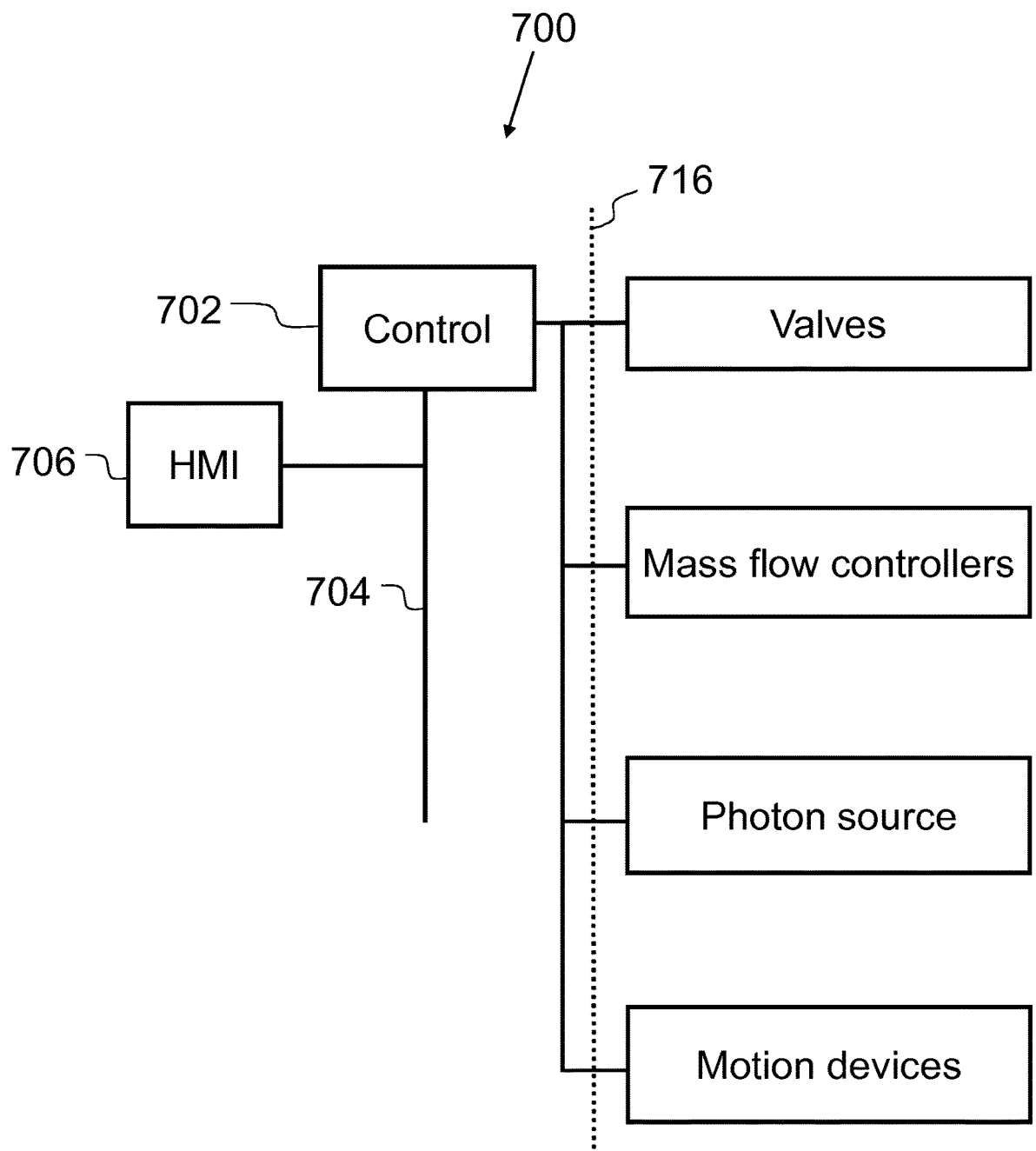
FIG. 7 shows a rough block diagram of a deposition apparatus control system in accordance with an example embodiment.

In an example embodiment, the in-feed line controlling elements form part of a computer controlled system. A computer program stored into a memory of the system comprises instructions, which upon execution by at least one processor of the system cause the coating apparatus, or deposition reactor, to operate as instructed. The instructions may be in the form of computer-readable program code. FIG. 7 shows a rough block diagram of a deposition apparatus control system 700 in accordance with an example embodiment. In a basic system setup process parameters are programmed with the aid of software and instructions are executed with a human machine interface (HMI) terminal 706 and downloaded via a communication bus 704, such as Ethernet bus or similar, to a control box 702 (control unit). In an embodiment, the control box 702 comprises a general purpose programmable logic control (PLC) unit. The control box 702 comprises at least one microprocessor for executing control box software comprising program code stored in a memory, dynamic and static memories, I/O modules, A/D and D/A converters and power relays. The control box 702 sends electrical power to pneumatic controllers of appropriate valves, and controls mass flow controllers of the apparatus. The control box controls the operation of the photon source, and the vacuum pump. The control box further controls any motion devices needed to move the substrate(s). The control box 702 receives information from appropriate sensors, and generally controls the overall operation of the apparatus. The control box 702 may measure and relay probe readings from the apparatus to the HMI terminal 706. A dotted line 716 indicates an interface line between reactor parts of the apparatus and the control box 702.

Without limiting the scope and interpretation of the patent claims, certain technical effects of one or more of the example embodiments disclosed herein are listed in the following: A technical effect is a method based on self-saturative growth with a faster deposition rate. Another technical effect is lower required processing temperature due to photon exposure. Another technical effect is simplified chemical usage by using a second processing gas as both a precursor and carrier gas. Another technical effect is self-saturative growth although both precursors are present in the reaction space simultaneously.

It should be noted the some of the functions or method steps discussed in the preceding may be performed in a different order and/or concurrently with each other. Furthermore, one or more of the above-described functions or method steps may be optional or may be combined.

The foregoing description has provided by way of non-limiting examples of particular implementations and embodiments of the present disclosure a full and informative description of the best mode presently contemplated by the inventors for carrying out the aspects of the disclosed embodiments. It is however clear to a person skilled in the art that the aspects of the disclosed embodiments are not restricted to details of the embodiments presented above, but that it can be implemented in other embodiments using equivalent means without deviating from the characteristics of the disclosed embodiments. It is to be noted that a metal precursor species has been used as an example for the first precursor species, and a non-metal precursor species as an example for the second precursor species in certain example embodiments. However, this must not be considered limiting. The first precursor can alternatively be a non-metal precursor. Both precursors can be, for example, non-metal precursors, etc. The choice of precursors is only dependent on the particular implementation and/or the desired coating material.

Furthermore, some of the features of the above-disclosed embodiments may be used to advantage without the corresponding use of other features. As such, the foregoing description should be considered as merely illustrative of the principles of the aspects of the disclosed embodiments, and not in limitation thereof. Hence, the scope of the disclosed embodiments is only restricted by the appended patent claims.

The invention claimed is:

1. A deposition method, comprising:
   providing a channel for a substrate through a deposition apparatus;
   feeding precursor vapor into the channel, wherein the precursor vapor comprises a first precursor species and a second precursor source gas, the second precursor source gas functioning as carrier gas for the first precursor species;
   depositing material from the precursor vapor onto the substrate on its way through the deposition apparatus by exposing the substrate to the precursor vapor and to alternating photon exposure and shade periods within the channel; and
   defining the photon exposure and shade periods by shading the substrate surface so that an area of shade has the shade period and a non-shaded area the photon exposure period.

2. The method of claim 1, wherein the channel restricts movement of the precursor vapor in a vertical direction.

3. The method of claim 1, wherein a first precursor species reacts with reactive sites on the substrate surface on the shade period and, on the following photon exposure period, a second precursor species reacts with chemisorbed first precursor species.

4. The method of claim 3, comprising:
   causing the reaction on the photon exposure period by received photon energy.

5. The method of claim 3, wherein the chemisorbed first precursor species is excited by photon energy during the photon exposure period to react with the gaseous second precursor species.

6. The method of claim 1, wherein reactions during the shade period are self-saturative surface reactions.

7. A deposition apparatus, comprising:
a channel for a substrate through the deposition apparatus;
at least one in-feed line for feeding precursor vapor into the channel, the precursor vapor comprising a first precursor species and a second precursor source gas, and the apparatus is configured to use the second precursor source gas as carrier gas for the first precursor species;
the deposition apparatus being further configured to:
deposit material from the precursor vapor onto the substrate on its way through the deposition apparatus by exposing the substrate to the precursor vapor and to alternating photon exposure and shade periods within the channel, the apparatus being configured to define photon exposure and shade periods by shading the substrate surface so that an area of shade has the shade period and a non-shaded area has the photon exposure period.

8. The apparatus of claim 7, the channel being configured to restrict movement of the precursor vapor in a vertical direction.

9. The apparatus of claim 7, wherein the apparatus is configured to cause:
a first precursor species to react with reactive sites on the substrate surface on the shade period and, on the following photon exposure period, a second precursor species to react with chemisorbed first precursor species.

10. The apparatus of claim 9, comprising:
a photon source configured to emit photon energy to cause the reaction on the photon exposure period.

11. The apparatus of claim 7, comprising:
a shader in between the substrate and a photon source having photon permeable areas and photon impermeable areas to define photon exposure and shade periods by shading the substrate surface so that an area of shade has the shade period and a non-shaded area the photon exposure period.

12. The deposition apparatus of claim 11, wherein the shader comprises flow channels in said photon impermeable areas in connection with the at least one in-feed line, said flow channels having apertures configured to guide precursor vapor towards the substrate surface.

13. The deposition apparatus of claim 11, wherein the shader forms a channel top part restricting movement of the precursor vapor in a vertical direction, and wherein the photon permeable areas are formed of material through which the precursor vapor cannot penetrate.

14. The deposition apparatus of claim 7, comprising an input port for inputting the substrate into the channel and an output port for outputting the substrate from the channel, the input port being arranged opposite to the output port.

15. The deposition apparatus of claim 7, comprising a reaction chamber surrounded by an outer chamber, and a shield gas line leading into an intermediate space between the outer chamber and the reaction chamber.

16. The deposition apparatus of claim 15, comprising a transfer chamber attached to a side of the outer chamber for substrate loading.

\* \* \* \* \*